United States Patent [19]

Yamada

[11] B 3,999,210
[45] Dec. 21, 1976

[54] FET HAVING A LINEAR IMPEDANCE CHARACTERISTIC OVER A WIDE RANGE OF FREQUENCY

[75] Inventor: Takaaki Yamada, Atsugi, Japan

[73] Assignee: Sony Corporation, Tokyo, Japan

[22] Filed: Sept. 9, 1974

[21] Appl. No.: 504,503

[44] Published under the second Trial Voluntary Protest Program on March 9, 1976 as document No. B 504,503.

Related U.S. Application Data

[63] Continuation of Ser. No. 391,464, Aug. 24, 1973, abandoned, which is a continuation-in-part of Ser. No. 358,168, May 7, 1973, abandoned.

[30] Foreign Application Priority Data

Aug. 28, 1972 Japan .............................. 47-85950

[52] U.S. Cl. ................................ 357/23; 307/304; 357/59; 357/65
[51] Int. Cl.[2] ........................................ H01L 29/78
[58] Field of Search ................. 357/23, 59, 65; 307/304

[56] References Cited

UNITED STATES PATENTS

| 3,436,622 | 4/1969 | Warner ................................. 357/23 |
| 3,676,921 | 7/1972 | Kool ..................................... 357/23 |
| 3,714,522 | 1/1973 | Komiya et al. ....................... 357/23 |

OTHER PUBLICATIONS

C. Hu et al., "A Resistive-Gated IGFET Tetrode," IEEE Trans. on Electron Dev., vol. ED-18, No. 7 July 1971, pp. 418–425.

*Primary Examiner*—Andrew J. James
*Assistant Examiner*—Joseph E. Clawson, Jr.
*Attorney, Agent, or Firm*—Hill, Gross, Simpson, Van Santen, Steadman, Chiara & Simpson

[57] ABSTRACT

A FET is provided having a linear impedance characteristic over a wide range. It comprises a semiconductor substrate of one impurity type with source and drain regions formed in one surface thereof of opposite highly doped impurity type. An insulating layer overlies said one surface and is of a relative thin thickness between a point above said source region and a point above said drain region, and is of a relative thick thickness throughout the rest of its extent. A polycrystalline resistance layer overlies the insulating layer over its thin thickness portion and over some of the thick portion of the insulating layer lying above the source region. Source and drain electrodes are formed on the insulating layer and have portions thereof extending through windows in the insulating layer into contact with said source and drain regions respectively. A gate electrode is formed on the resistive layer above the thick portion of said insulating layer and extends back from the drain facing face of the source region by a predetermined distance.

5 Claims, 4 Drawing Figures

FET HAVING A LINEAR IMPEDANCE CHARACTERISTIC OVER A WIDE RANGE OF FREQUENCY

BACKGROUND OF THE INVENTION

This is a continuation of application Ser. No. 391,464, filed Aug. 24, 1973 now abandoned which is a continuation-in-part of application Ser. No. 358,168 filed May 7, 1973, now abandoned.

FIELD OF THE INVENTION

This invention relates to an improved field effect transistor (FET) and more particularly to a variable impedance FET having a linear characteristic over a wide range.

Recently, a variable impedance element having a non-contact construction has been desired in industry, particularly for four-channel stereophonic resistors as well as for analog computers, and AGC circuits. Conventional FETs, CdS photo-conductive element, and other devices are known, but to maintain relatively low distortion and linearity, the amplitude of the input signal must be kept relatively small, and less than some relative low predetermined level. This means the S/N ratio must have a predetermined ceiling value, which will be desired to be increased more and more in view of the requirement for Hi-Fi equipment, which require low noise level.

SUMMARY OF THE INVENTION

It is an object of the present invention to provide a novel FET device which has a linear impedance characteristic over a wide rante.

It is a further object of this invention to provide a novel FET construction, whose characteristics are an improvement over the constructions described in my copending application, Ser. No. 358,168.

It is a still further object of the present invention to provide a novel FET having three terminals exclusive of the substrate terminal.

Another and further object is to provide a novel FET for high frequency range.

Other objects, features and advantages, as well as equivalent structures which are intended to be covered hereby, will become more apparent to those versed in the art in connection with the teaching of the principles of the present invention with the disclosure of the preferred embodiment in the specification, claims and drawings, in which:

DESCRIPTION OF THE PRIOR ART

Figure 1:
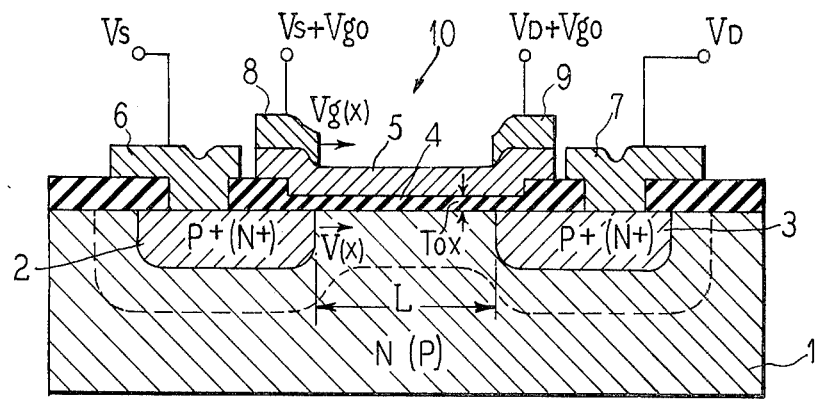
FIG. 1 is a diagrammatic sectional view typifying the type of construction disclosed in my copending application Ser. No. 358,168.

A resistive layer overlying an insulating layer on a semiconductor substrate is disclosed in U.S. Pat. No. 3,714,522.

DESCRIPTION OF THE PREFERRED EMBODIMENT

In order to understand the present invention and to recognize the differences and improvements with respect to the structure taught in my copending application Ser. No. 358,168, a brief description will be given of a preferred form of this parent application. Specifically, a structure 10 is disclosed in the parent application, as exemplified in FIG. 1 herein. A semiconductor substrate 1 of N (or P) -type has a P+ (N+) -type source region 2 and a P+ (N+) -type drain region 3 formed in one surface thereof and spaced by a distance L from each other. On the surface of the substrate 1 or at least in between the source 2 and the drain 3, an insulating layer 4, such as a $SiO_2$ film, is formed and further on the insulating layer 4 a resistive layer 5 is formed. By way of example, this layer may be polycrystalline silicon material whose surface resistivity is 10 kilo-ohms per square to 30 giga-ohms per square. A metallic electrode 6 for source 2 and a metallic electrode 7 for drain 3 are respectively attached thereto and a first gate electrode 8 close to the source electrode 6 and a second gate electrode 9 close to the drain electrode 7 are also attached on the resistive layer 5. The drain facing edge of electrode 8 must be exactly coincident with the drain facing edge of source 2, similary, the source facing edge of electrode 9 must be exactly coincident with the source facing edge of drain 3. Any variation from this precise arrangement causes distortion, as mentioned later.

The substrate 1, by way of example, is of a relatively low impurity density. Particularly, in case of an integrated circuit in which normally a further substrate is provided under the substrate 1 having a different conductive type thereto is provided, the density of the substrate 1 is such as to provide a resistivity of about 50 ohm-cm or more to avoid or reduce the effect of the IC substrate and further the densities of the regions 2 and 3 are respectively about $10^{19}$ atoms/cm$^3$. The length L of the channel is about 20 microns, its width is about 300$\mu$ and the thickness of the insulating layer 4, Tox, in case of $SiO_2$, is about 1200 A (angstrom). The layer 5 of polycrystalline silicon is about 1$\mu$ in thickness. The surface resistivity thereof is in the range of 10 kilo-ohm/square - 30 giga-ohm/square where the resistivity is very high of the layer 5, special contacts must be used for the electrodes 8 and 9. In such construction, a potential V(x) at point X in the channel area spaced some distance from the source region 2, a gate voltage $V_G(X)$ at the corresponding point in the gate and a threshold voltage of this device Vth are respectively defined as:

$$V_G(X) - V(X) \geqq Vth$$

where variation of Vth due to the voltage of the substrate 1 is very small or negligible, then the number of charge carriers N at the point X per unit area will be given as follows:

$$N = \frac{Co}{q}\{V_G(X) - V(X) - Vth\}/cm^{-2}$$

where
$Co = Eox/Tox$
$Eox$: dielectric constant of the insulating layer 4,
$q$: electron charges of the carrier, On the other hand, resistance $R(X)$ in the channel between the end of the region 2 and the point $X$ will be $$dR(X) = \rho_x(X) \frac{dX}{W}$$

$$\rho_x(X) = \frac{1}{Nq\mu}$$

where $\rho_x(X)$ is the surface resistivity of the channel, and $\mu$ is the mobility of the charge carriers:

As a result, $$dR(X) = \frac{1}{Co\,\mu\{V_G(X) - V(X) - Vth\}} \cdot \frac{dX}{W}$$

Accordingly, the channel current $I$ will be $$I\,dR(X) = dV(X)$$
$$= \frac{I}{W\,\mu Co\{V_G(X) - V(X) - Vth\}} dX \qquad (1)$$

If $$V_G(X) - V(X) = V_{GO} = \text{constant} \qquad (2)$$

is supposed: and the equation 1 integrated from $x = 0$ to $x - L$ (channel length):

$$\int_0^V \{V_G(X) - V(X) - Vth\}\,dV(X) = \frac{L}{W\,\mu Co} I$$

That is, $$I = \beta\,(V_{GO} - Vth)\,V \qquad (3)$$

will be obtained:
where $V = V(L)$, $$\beta = \frac{W\,\mu Co}{L}.$$

Finally, it should be noted that the equation (3) is a linear function with the condition (2). In case the potentials of source 2 and drain 3 are $V_S + V_{GO}$ and the 2nd gate electrode 9 should be $V_D + V_{GO}$ as shown in FIG. 1 and the equation 3 can be satisfied.

This means, a first linear equation ($E=RV$) in the channel between source 2 and drain 3 can be obtained and the channel resistance $R(X)$ will be on a linear line. The resistance or impedance can be controlled only by the gate voltage $V_{GO}$. With this device 10, a variable impedance circuit can be easily constructed.

Figure 3:
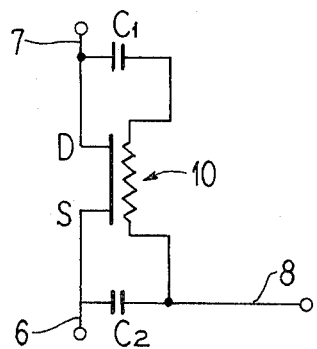
FIG. 3 is a circuit diagram of a fundamental circuit employing an FET of the construction shown in FIG. 1.

As shown in FIG. 3, drain is connected to a terminal which is also connected to the second gate electrode 9 through an internal or external condenser $C_1$. Further, the source is connected to a terminal which is also connected to the first gate electrode 8 through an internal or external condenser $C_2$. A control terminal is connected to the first gate electrode to which a control signal is applied. In such a case, if desired, a backgate voltage (biasing in reverse) will be applied to the substrate 1. In case of P-channel enhancement type, a positive backgate voltage will be applied and a control voltage $V_{GO}$ will be negative.

An input signal of frequency $f_1$, the control signal $V_{GO}$ of frequency $f_2$, Capacity $C_1$ of the condenser $C_1$, capacity $C_2$ of the condenser $C_2$ and resistance $R_5$ between the first and second gate electrodes (resistance of the resistive layer 5) are respectively defined, where $$f_1 \gg f_2$$

where $f_2$ is usual d.c. or low frequency $$R_5 \gg \frac{1}{2\pi f_1 C_1}$$

$$R_5 \gg \frac{1}{2\pi f_1 C_2}$$

are also decided.

Then, the reactances of the condensers $C_1$ and $C_2$ are small from the standpoint of $f_1$ of the input signal, on the other hand, are large from the standpoint of $f_2$ of $V_{GO}$, the gate potentials of the first electrode and the second electrode should be respectively $V_S + V_{GO}$ and $V_D + V_{GO}$.

Therefore, in accordance with the equation 3, a linear impedance characteristic between source and drain is obtained, which can be adjusted by the control signal $V_{GO}$ applied at the electrode 8. The circuit arrangement shown in FIG. 3 is very simple and thus will be suited for an AGC circuit because the necessary condition $f_1 \gg f_2$ can be satisified therein.

An FET as shown in FIG. 1 and a circuit arrangement as shown in FIG. 3 is very suitable for a low frequency range and is not suitable for most high frequency operations. Namely, if a high frequency driver is operated, the capacitance between the second gate electrode 9 and the drain region 3 or drain electrode 7 will be harmful and a leakage current will result. Accordingly, at high frequency, the channel resistance (impedance) can not be controlled easily by the gate voltage $V_{GO}$ only. Further, the range of variable resistance may become smaller. In addition, due to the electrode 9, the area of the drain region 3 must necessarily be relatively large and the junction capacitance between the substrate 1 and the drain 3 cannot be neglected in the high frequency range.

Figure 2:
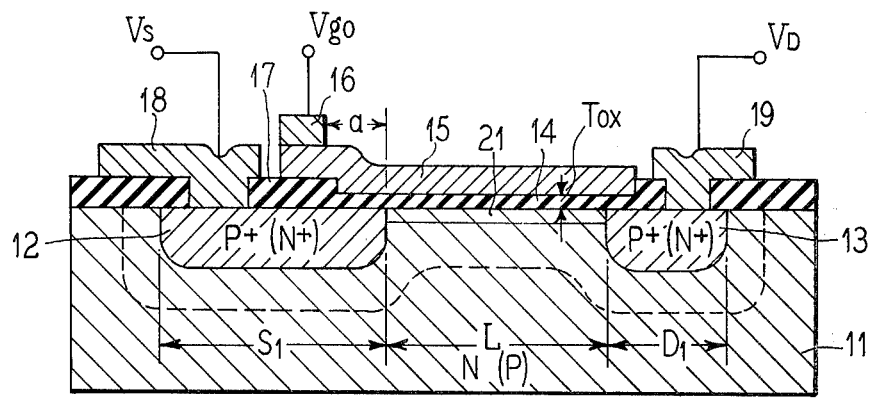
FIG. 2 is a diagrammatic sectional view of an FET embodying the present invention.

In the present invention, a preferred form of which is illustrated in FIG. 2, only one gate electrode is provided. Referring to FIG. 2, a substrate 11 of N (P) -type has formed in one surface thereof a P+ (N+) -type source region 12 and a P+ (N+) -type drain region 13 which are spaced at a distance L from each other. On the surface of the substrate 11 in between the source and drain regions 12 and 13, a gate insulator ($SiO_2$ layer) 14 is formed as a result thereof, a channel 21 will be formed under the gate insulator 14. Further, on the insulator 14, a resistive layer 15 is formed preferably of polycrystalline silicon. A single gate electrode 16 is formed above the source region 12 and over a thicker portion 17 of the layer of insulating material. The distance $a$ from the edge of the drain facing face of the source region 12 indicates the preferred spacing.

Source and drain electrodes 18, 19 are attached as shown. In the specifically illustrated embodiment, the resistivity of the substrate 11 is $\rho = 50$ ohm-cm (i.e., lowly doped) and the impurity concentrations of source and drain are respectively $10^{20}$ atoms/$cm^3$ (i.e., highly doped). The length of the channel L is 10 microns and $S_1$, $D_1$ are respectively 42.5 microns and 20 microns. The thickness Tox of the insulator 14 is about 1000 A, but the thickness of the layer 17 at the source region is about 1.2 microns and $a$ is about 2.5 microns. The resistive layer 15 is made of a polycrystalline silicon and the thickness thereof is about 1 micron. The sheet resistivity is 10 K-ohm/square∼30 giga-ohm/square.

According to this invention, with a single gate electrode, a gate control voltage $V_{GO}$ will be applied as a constant value all over channel 21. That is, in the case where an input signal having a high frequency $f_1$ is applied between source and drain, and a control signal having a voltage $V_{GO}$ of low frequency $f_2$ (where $f_1 > f_2$) is applied, the voltage at the drain edge of the resistive layer 15 is $V_D + V_{GO}$ because the drain voltage $V_D$ will be added to the layer 15 through the internal capacitor between the channel 21 and the layer 15. On the other hand $V_S + V_{GO}$ is applied to the gate electrode 16 and as a result the potential relation is just the same as FIG. 1. Accordingly, the potential difference throughout channel 21 between source and drain will be constant, and the condition for good linearity will be satisfied. (See equation (2)).

Figure 4:
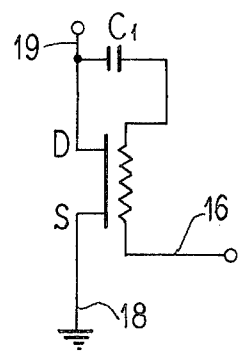
FIG. 4 is a circuit diagram of a circuit employing an FET of the novel construction shown in FIG. 2.

FIG. 4 shows a circuit using the FET of FIG. 2 in which the source electrode 18 is grounded ($V_S = 0$) and to the gate electrode 16 only a gate voltage $V_{GO}$ will be applied. The capacitor $C_1$ between gate and channel, shows an internal or parasitic capacitance.

The present invention, as exemplified by FIG. 2, possesses certain distinct advantages. Only $a$ need be adjusted during fabrication to a desired value within the range $a > 0$. The fabrication is, therefore, easy. $D_1$ is smaller than that of FIG. 1 because there is no gate electrode 9. This means that the junction capacitance between drain and substrate will be smaller. Hence, the fact that $S_1$ is greater than $D_1$ is one of the features of this invention. Owing to the thicker and more extensive, portion 17 of the insulating layer, the gate is free from the input signal, particularly in case of the source configuration. Finally, according to this invention, the length L of the channel can be shorter than in construction as shown in FIG. 1. This means that the FET of this invention is more suitable for high frequency use. Indeed, several hundred MHz FET having a good linearity may be obtained.

It will be apparent to those skilled in the art that many modifications and variations may be effected without departing from the spirit and scope of the novel concepts of the present invention.

I claim as my invention:

1. A field effect transistor comprising: a semiconductor substrate of one impurity type, two spaced regions of opposite conductivity type in respect to said substrate in one face thereof providing laterally separated source and drain regions and defining a channel region therebetween having ends adjacent said two spaced regions, a first insulating layer overlying said one face, a second one-piece resistive polycrystalline layer having a resistivity in the range from 10,000 ohms/square to 30 giga-ohms/square overlying said first insulating layer over said channel region and above a portion of said source and drain regions, and a single gate electrode in ohmic contact with the portion of said second resistive polycrystalline layer which overlies said source and drain regions, and said gate electrode mounted so that none of it overlies said channel region and its edge nearest said channel is spaced a distance laterally from said channel.

2. A field effect transistor comprising: a semiconductor substrate of one impurity type, two spaced regions of opposite conductivity type in respect to said substrate in one face thereof providing laterally separated source and drain regions and defining a channel therebetween having ends adjacent said source and drain regions, a first layer of insulating material overlying said one face, a second one-piece layer of resistive material having a resistivity in the range from 10,000 ohms/square to 30 giga-ohms/square overlying said first insulating layer, a single gate electrode in ohmic contact with a portion of said second resistive layer which overlies said source region and the edge of said gate electrode above said source region which faces the drain overlying said source region and laterally offset a distance from said channel.

3. A field effect transistor comprising a substrate, source and drain regions laterally separated and formed in one surface of said substrate and defining a channel therebetween having ends adjacent said source and draing regions, a first insulating layer on said one surface and having a first portion extending between said source and drain regions over said channel, a one-piece resistive layer having a resistivity in the range of 10,000 ohms/square to 30 giga-ohms/square on said insulating layer contiguous and integral with said insulating layer, a second portion of said first layer lying over said source region and being thicker than said first portion of said first layer at least over a substantial portion of said source region, said resistive layer formed over all of said first portion of said first layer as well as over said second portion of said first layer over said source region, a single gate electrode formed on said second layer and all of said gate electrode located laterally a distance away from one end of said channel, and source and drain electrode formed on said source and drain regions, respectively.

4. A field effect transistor comprising: a semiconductor substrate, source and drain regions formed in one surface of said substrate and laterally separated and defining a channel therebetween having ends adjacent said source and drain regions, a first insulating layer extending between said source and drain regions on said one surface of said substrate over said channel and partially overlying at least one of said regions, a second one-piece resistive layer having a resistivity in the range of 10,000 ohms/square to 30 giga-ohms/square formed on said first insulating layer, and a signle gate electrode in contact with said second resistive layer and said gate electrode formed only over said one of said regions and its edge nearest said channel is spaced a distance laterally from said channel.

5. A field effect transistor as set forth in claim 4, in which said first insulating layer has a thicker portion over at least said one of said regions and wherein said gate electrode lies on said resistive layer over said thicker portion of said first insulating layer.

* * * * *